(12) United States Patent
Bachman et al.

(10) Patent No.: US 11,331,663 B2
(45) Date of Patent: May 17, 2022

(54) MICROFLUIDIC COMPONENT PACKAGE

(71) Applicant: THE REGENTS OF THE UNIVERSITY OF CALIFORNIA, Oakland, CA (US)

(72) Inventors: Mark Bachman, Irvine, CA (US); Sarkis Babikian, Glendale, CA (US); Guann-Pyng Li, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 36 days.

(21) Appl. No.: 16/168,020

(22) Filed: Oct. 23, 2018

(65) Prior Publication Data
US 2019/0321821 A1    Oct. 24, 2019

Related U.S. Application Data

(63) Continuation of application No. PCT/US2017/035056, filed on May 30, 2017.

(60) Provisional application No. 62/343,169, filed on May 31, 2016.

(51) Int. Cl.
| | |
|---|---|
| *B01L 3/00* | (2006.01) |
| *B01L 9/00* | (2006.01) |
| *B81B 7/00* | (2006.01) |
| *B81C 1/00* | (2006.01) |
| *B23K 1/00* | (2006.01) |
| *B23K 101/42* | (2006.01) |

(52) U.S. Cl.
CPC ... *B01L 3/502715* (2013.01); *B01L 3/502707* (2013.01); *B01L 9/527* (2013.01); *B23K 1/0016* (2013.01); *B81B 7/0061* (2013.01); *B81C 1/00309* (2013.01); *B01L 2200/027* (2013.01); *B01L 2200/0689* (2013.01); *B01L 2400/0677* (2013.01); *B23K 2101/42* (2018.08); *B81B 2201/058* (2013.01); *B81C 2203/0172* (2013.01); *B81C 2203/035* (2013.01)

(58) Field of Classification Search
CPC ......... B01L 3/502715; B01L 3/502707; B01L 9/527; B01L 2200/027; B01L 2200/0689; B01L 2400/0677; B23K 1/0016; B23K 2101/42; B81B 7/0061; B81B 2201/058; B81C 1/00309; B81C 2203/0172; B81C 2203/035
See application file for complete search history.

(56) References Cited

U.S. PATENT DOCUMENTS

| | | | |
|---|---|---|---|
| 6,443,179 B1 * | 9/2002 | Benavides | F15C 5/00 137/454.2 |
| 6,586,885 B2 * | 7/2003 | Coll | G01N 21/31 216/41 |

(Continued)

FOREIGN PATENT DOCUMENTS

WO    WO-2007107901 A2 *    9/2007    ........ B01L 3/502707

OTHER PUBLICATIONS

Amy Wu, et al., "Modular integration of electronics and microfluidic systems using flexible printed circuit boards", 2010, Lab Chip, 10, 519-521 (Year: 2010).*

*Primary Examiner* — Kathryn Wright
*Assistant Examiner* — Henry H Nguyen
(74) *Attorney, Agent, or Firm* — One LLP

(57) ABSTRACT

A microfluidic component package that is readily integratable within a microfluidic system.

12 Claims, 3 Drawing Sheets

(56) References Cited

U.S. PATENT DOCUMENTS

| | | | |
|---|---|---|---|
| 7,004,198 B1* | 2/2006 | Okandan | B01L 3/565 137/554 |
| 9,101,929 B2* | 8/2015 | Ehrenpfordt | B01L 3/5027 |
| 2007/0003434 A1* | 1/2007 | Padmanabhan | B01L 3/50273 422/400 |
| 2012/0267239 A1* | 10/2012 | Chen | B01L 3/502715 204/242 |
| 2015/0182967 A1* | 7/2015 | Coursey | B01L 3/502707 435/91.2 |

* cited by examiner

MICROFLUIDIC COMPONENT PACKAGE

CROSS-REFERENCE TO RELATED APPLICATIONS

The subject application is a continuation of PCT Patent Application No. PCT/US17/35056, filed May 30, 2017, which claims priority to U.S. Provisional Patent Application No. 62/343,169, filed on May 31, 2016, both of which are incorporated by reference herein in their entirety for all purposes.

FIELD

The subject matter described herein relates generally to microfluidic systems and their manufacture, and more specifically the packaging of devices that can interact with small volumes of fluid for the purpose of embedding them within microfluidic systems.

BACKGROUND

Microfluidic systems are of use for applications where small quantities of fluid need to be manipulated and controlled. Two common applications are 1) for high throughput analysis, where large numbers of small volume experiments are performed; and 2) point of care analysis, where an assay is to be performed on a small liquid sample such as blood or saliva. While microfluidics has shown great promise for these applications, a significant problem exists for the integration of microfluidic functions with other common functions, such as mechanical, optical, and electrical functions. A truly useful system must integrate these disparate functions together into a single device.

Conventional microfluidic production approaches produce capillary systems in polymer, glass, or other materials using embossing or etch methods. These methods are efficient at producing microfluidic channels, but they are poor for integrating electronics, optics, and mechanical functions into the same system. Usually, these non-fluidic functions are added as external components after the microfluidics have been produced. In some cases, attempts are made to include these functions during the manufacture of the microfluidic channels; however, this results in highly complex and expensive manufacturing processes that are not suitable for large-scale production. Moreover, this process requires that the designer and manufacturer be expert in producing all of the individual parts of a system, such as micro-pumps, micro-valves, micro-heaters, micro-electrodes, micro-sensors, and the like. FIG. 1 shows an example of a conventional microfluidic device which comprises a flat substrate 101, typically comprising plastic or glass, with openings 103 to allow fluid to be introduced and extracted from a network of micro-channels 105, or capillaries, whose function is to move fluid from one location to another. Some of the micro-channels 107 are constructed in such a manner to provide additional functionality to the device, such as heating, valving or pumping. These parts are manufactured in the same process as the manufacture of the micro-channels. Most of the fluidic functions are provided externally 109 to the device.

An alternative approach is to build specific microfluidic parts as small, discrete devices, and then embed these as individual components within a larger microfluidic system. This allows each part to be designed and manufactured separately, increasing quality and reducing production cost. FIG. 2 shows an example of a conventional microfluidic device including discrete components. As shown, the microfluidic device comprises a flat substrate 201, typically comprising plastic or glass, with openings 203 to allow fluid to be introduced and extracted from a network of micro-channels 205, or capillaries, whose function is to move fluid from one location to another. Discrete components 207, 209 are attached or embedded within the device in such a manner to access the fluid in the micro-channels and provide functionality. Components, such as, e.g., the component 209, connect with the microfluidic channels, but may also connect with external systems, such as electrical traces 211.

To embed the components within the larger microfluidic system, the components need to be connected to one or more microfluidic channels, and may require other connections such as electrical, optical, mechanical, or thermal connections. Currently, there is no way to accomplish this in a consistent manner that is compatible with large-scale manufacturing.

SUMMARY

The various embodiments provided herein are generally directed to a component package that enables a microfluidic device to be fixed to a printed circuit board or other substrate, and embedded within a larger microfluidic system. Microfluidic components enable conventional microelectronic infrastructure and technology to be merged with microfluidic systems. The embodiments presented are herein referred to as a "microfluidic component package" or MFCP.

In embodiments, a microfluidic component comprises a small device intended to be embedded within a microfluidic system. The component typically comprises one or more ports that allow the component to come in contact with fluid that is routed on a microfluidic layer, and to perform a function that is useful to the operation of the microfluidic system. The device is manufactured by any means that is reasonable. Microfluidic components may perform operations such as micro-pumps, micro-valves, micro-heaters, micro-electrodes, micro-sensors, etc. A microfluidic component package (MFCP) allows a device to be readily integrated with the microfluidic system.

In embodiments, the MFCP is small enough to be mounted on a printed circuit board or other surface. It is comprised of molded polymer which houses or encapsulates one or more microfluidic devices, and has one or more access openings, or ports, to allow fluid to enter the package and interact with the enclosed device. The ports are temporarily sealed to allow the MFCP to be handled and assembled using automation technology during production of the system, but are opened after the MFCP has been embedded within the microfluidic system.

Other systems, methods, features and advantages of the example embodiments will be or will become apparent to one with skill in the art upon examination of the following figures and detailed description.

BRIEF DESCRIPTION OF FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the disclosure. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Each of the additional features and teachings disclosed below can be utilized separately or in conjunction with other features and teachings to provide a microfluidic component package and methods of manufacture. Representative examples of the embodiments described herein, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the disclosure. Therefore, combinations of features and steps disclosed in the following detail description may not be necessary to practice the disclosure in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The various embodiments provided herein are generally directed to a microfluidic component package ("MFCP") that can produce a consistent interface between a small microfluidic device and a larger microfluidic system, while also allowing access to electrical, optical, mechanical, and thermal connections. The MFCP may comprise one or more microfluidic devices contained within it, and the MFCP is intended to be embedded within a larger microfluidic system.

Figure 1:
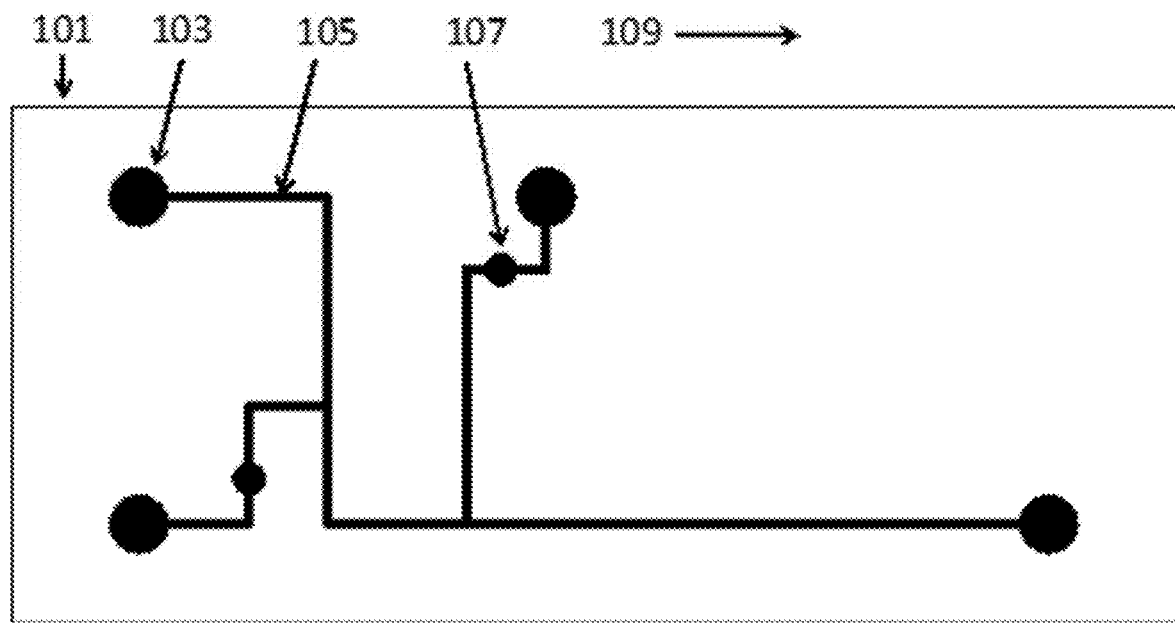
FIG. 1 is a schematic of microfluidic system has microchannels and active parts that operate as valves, pumps, and similar functions. These are all fabricated at the same time, in the same substrate, as the microfluidics.
Figure 2:
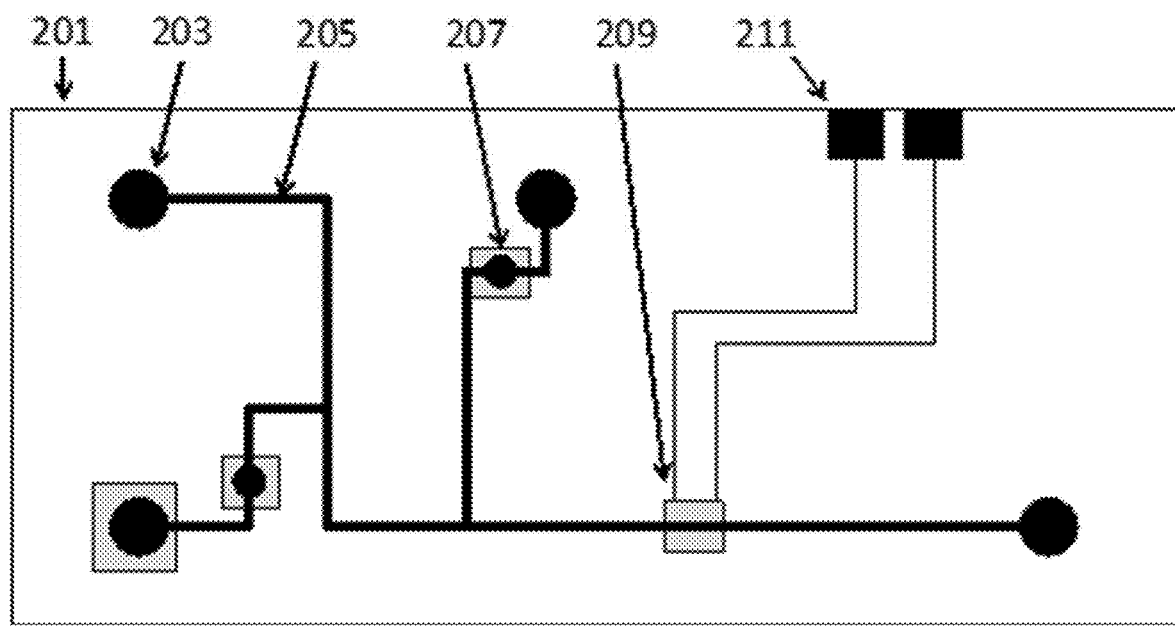
FIG. 2 is a schematic of microfluidic system that utilizes individual devices that are manufactured separately and then embedded within the system when manufacturing the microfluidics.
Figure 3:
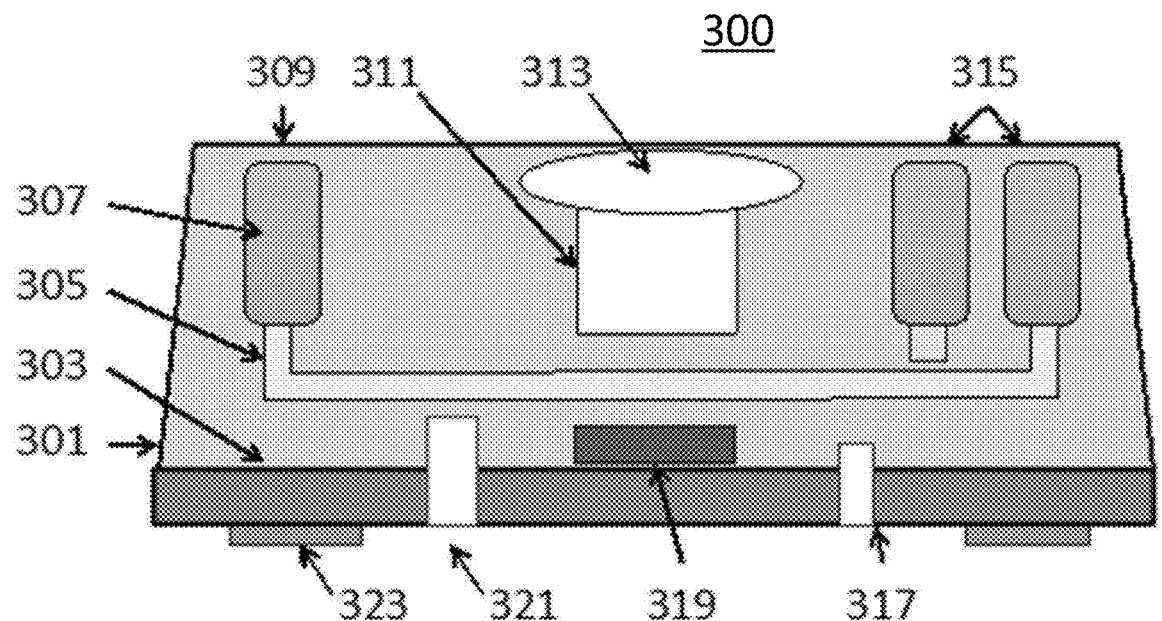
FIG. 3 is a cross-sectional view of an exemplary microfluidic component package MFCP with multiple devices and ports, according to embodiments of the present disclosure.

FIG. 3 shows an exemplary MFCP 300, according to embodiments of the present disclosure. The MFCP 300 comprises an enclosure 301 which may be solid filled or may comprise a hollow interior. The enclosure 301 may be paired with a substrate 303 on one or more sides, for example the bottom, to add additional functionality to the package or to assist in attachment to a larger system. Within the enclosure 301 are one or more microfluidic elements that add functionality to a microfluidic system such as micro-channels 305. In the preferred embodiment, the micro-channels 305 are encapsulated within the package or enclosure 301. One or more ports 309 and 315 may be defined to allow access to the microfluidic elements/micro-channels 305 inside the enclosure 301. A sacrificial material 307 may be used to connect a microfluidic element to the port of the package. The sacrificial material 307 is known to be dissolvable or etchable by a suitable chemical. At a later time, a physical connection can be made from the port to the microfluidic element by first making an opening in the enclosure 301 at the location of the port 309, 315, then removing the sacrificial material 307 by dissolving or etching the sacrificial material 307 away using an appropriate chemical. This provides an opening between the outside of the package and the microfluidic elements 305 inside.

The enclosure 301 may include cavities 311, and may provide optical openings 313, such as lenses, filters, mirrors, and the like. Ports 315 may be used to provide access to other features of the enclosed device, such as pneumatic, hydraulic, mechanical, or thermal access. Ports may be provided on all sides of the enclosure, including ports 317 through the bottom substrate.

The enclosure 301 may include elements 319 in addition to microfluidic elements, such as microelectronic devices, including light sources, photosensors, computers, and electronics.

The enclosure 301 may also include features that allow it to be attached to conventional systems, such as tapped holes 321 for screws or contact pads 323 for soldering the device 300 to a printed circuit board. The contact pads 323 also allow electrical energy to enter and leave the package.

The MFCP may be embedded within any microfluidic system. However, in the preferred embodiment a microfluidic system for embedding the MFCP within comprises a network of microfluidic channels prepared on a printed circuit board.

Figure 4:
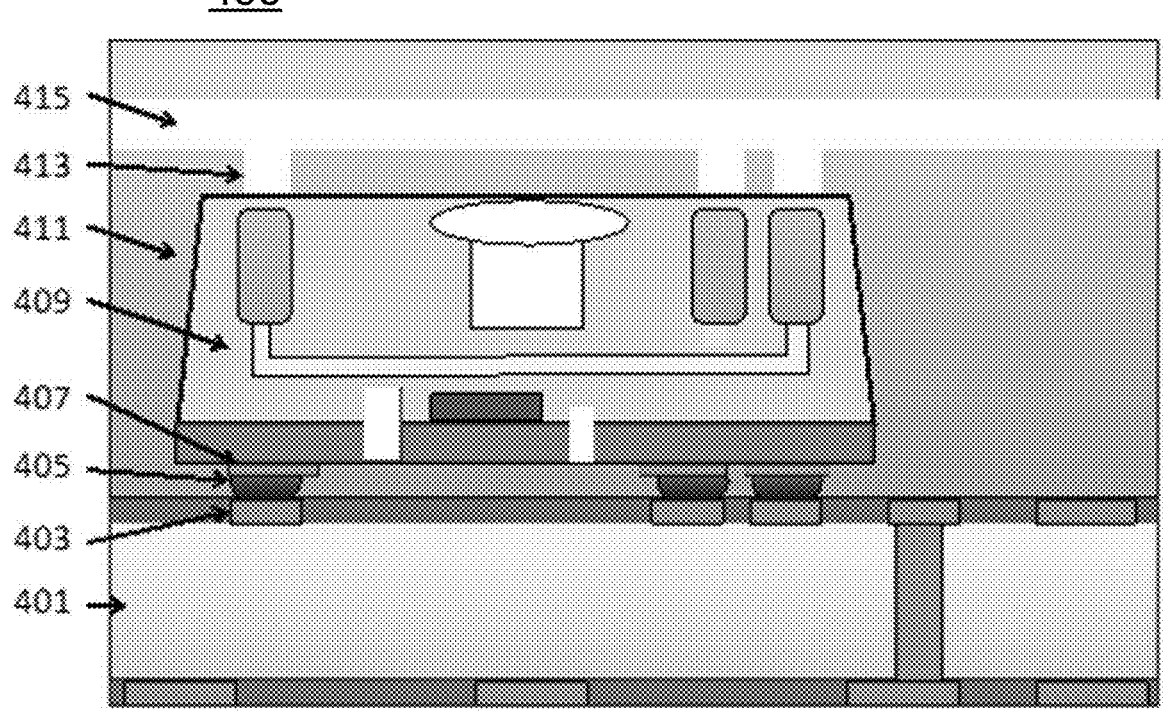
FIG. 4 is a cross-sectional view of MFCP embedded within a microfluidic system and electronic circuit board, according to embodiments of the present disclosure.

FIG. 4 shows the preferred method for embedding the MFCP in a larger microfluidic system 400. In this embodiment, a printed circuit board (PCB) 401 is prepared having a solid material and electrical traces for routing electrical signals. The PCB 401 comprises specific contact pads 403 for connecting to a component such as an MFCP 409. Mounting is most commonly performed using solder 405, which connects the contact pads from the PCB 403 with the contact pads 407 on the MFCP 409. The solder connections 405 provide electrical connection as well as mechanical connection.

The MFCP 409 that comprises the microfluidic and other elements is encapsulated within a material 411 (e.g., polymer). Openings 413 are provided in the encapsulating material (e.g., polymer) 411 to allow fluidic access from a microfluidic channel 415 to the ports of the MFCP 409. Microfluidic channels 415 are fabricated on the encapsulating material (e.g., polymer) 411 forming the larger microfluidic system 400.

FIGS. 5A-5D illustrate how an MFCP 501 may be embedded within a printed circuit board and microfluidic system.

Figure 5A:
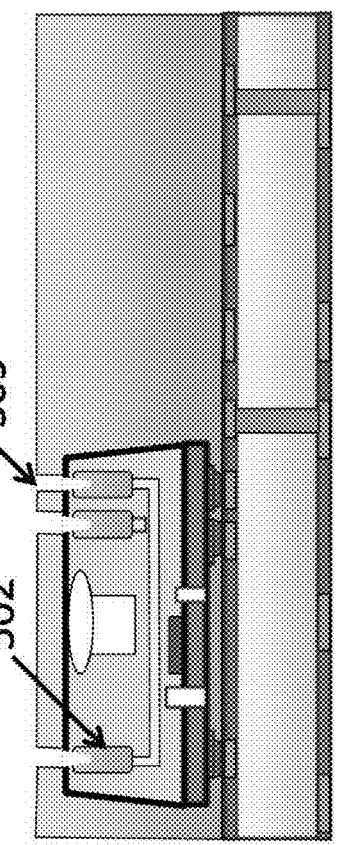
FIG. 5A illustrates a first step in an exemplary MFCP embedding process, according to embodiments of the present disclosure.

FIG. 5A illustrates a first step in an exemplary MFCP embedding process, according to embodiments of the present disclosure. As shown in FIG. 5A, the MFCP 501 is mounted on a printed circuit board 503 using technology such as soldering.

Figure 5B:
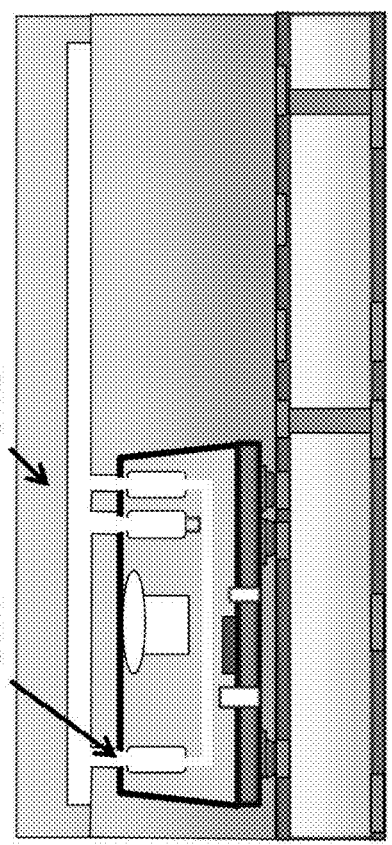
FIG. 5B illustrates a second step in an exemplary MFCP embedding process, according to embodiments of the present disclosure.

FIG. 5B illustrates a second step in an exemplary MFCP embedding process, according to embodiments of the present disclosure. As shown in FIG. 5B, an encapsulating polymer 505 is used to cover the MFCP 501 and printed circuit board 503. The encapsulating polymer 505 is embossed or planarized to produce a suitable surface, for example, a flat surface 507.

Figure 5C:
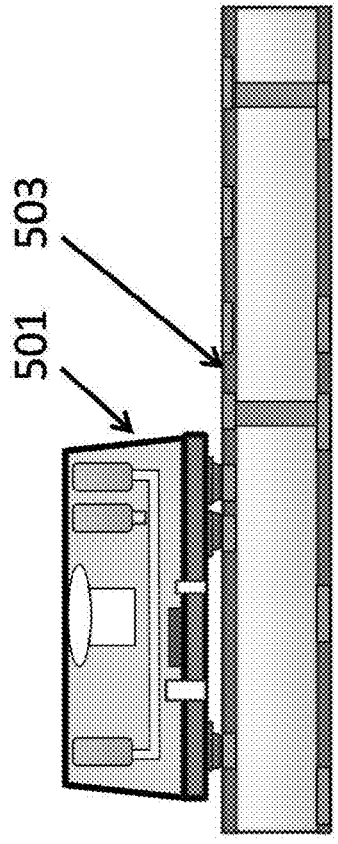
FIG. 5C illustrates a third step in an exemplary MFCP embedding process, according to embodiments of the present disclosure.

FIG. 5C illustrates a third step in an exemplary MFCP embedding process, according to embodiments of the present disclosure. As shown in FIG. 5C, one or more holes 509 are drilled through the encapsulating polymer 505 to produce openings in the package and expose the sacrificial material 502 within.

Figure 5D:
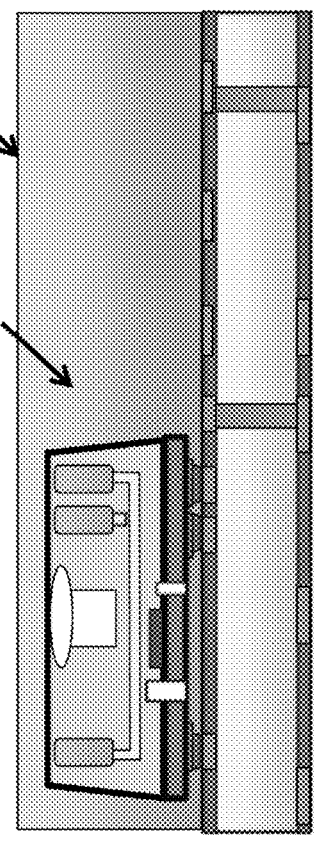
FIG. 5D illustrates a fourth step in an exemplary MFCP embedding process, according to embodiments of the present disclosure.

FIG. 5D illustrates a fourth step in an exemplary MFCP embedding process, according to embodiments of the present disclosure. As shown in FIG. 5D, the sacrificial material 502 is removed by dissolution or etching 511, opening up the microfluidic elements within the package. A microfluidic layer 513 is bonded to the encapsulating material to form a sealed microfluidic system.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances, entities are described herein as being coupled to other entities. It should be understood that the terms "coupled" and "connected" or any of their forms are used interchangeably herein and, in both cases, are generic to the direct coupling of two entities without any non-negligible e.g., parasitic intervening entities and the indirect coupling of two entities with one or more non-negligible intervening entities. Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed:

1. A microfluidic component package comprising
an enclosure,
one or more microfluidic elements formed within the enclosure,
one or more openings formed in the enclosure to allow the one or more microfluidic elements to have contact with fluid,
a cavity disposed within the enclosure,
an optical element disposed on a first end of the cavity, wherein the cavity is between the optical element and the one or more microfluidic elements, wherein a second end of the cavity is facing the one or more microfluidic elements,
a mechanism on the enclosure to connect to a surface, and
a microelectronic device disposed within the enclosure and outside of the cavity, wherein the one or more microfluidic elements is between the cavity and the microelectronic device.

2. The microfluidic component package of claim 1, wherein the microelectronic device is disposed directly below the cavity and the optical element.

3. The microfluidic component package of claim 1, wherein the microelectronic device comprises a photosensor or a light source.

4. The microfluidic component package of claim 1, wherein the enclosure contains an opening to allow the fluid to enter and leave the interior of the enclosure, a sacrificial material for temporarily blocking the opening, wherein the sacrificial material is removable after placing the microfluidic component package within a microfluidic system.

5. The microfluidic component package of claim 4, wherein the sacrificial material is a material that can be removed using one of water, solvent, etchant, plasma, and evaporation.

6. The microfluidic component package of claim 1, further comprising electrical contacts coupled to the enclosure to allow electrical signal to enter and leave the enclosure.

7. The microfluidic component package of claim 1, wherein the optical element comprises one or more of lenses, mirrors, diffractive optics, optical filters and optical attenuators.

8. The microfluidic component package of claim 1, further comprising a mechanical coupling to allow mechanical energy to enter and leave the enclosure.

9. The microfluidic component package of claim 8, wherein the mechanical energy comprises one or more of pneumatic forces, hydraulic forces, and direct stressing forces.

10. The microfluidic component package of claim 1, further comprising thermal coupling to allow heat energy to enter and leave the enclosure.

11. The microfluidic component package of claim 1, wherein the microfluidic component package is encapsulated within a microfluidic system.

12. The microfluidic component package of claim 1, wherein the microfluidic component package is mounted to a printed circuit board.

\* \* \* \* \*